Jan. 5, 1971 E. F. KING 3,553,541

BILATERAL SWITCH USING COMBINATION OF FIELD EFFECT TRANSISTORS AND BIPOLAR TRANSISTORS

Filed April 17, 1969

INVENTOR
E. F. KING
BY
A. J. Torsiglieri
ATTORNEY

United States Patent Office 3,553,541
Patented Jan. 5, 1971

3,553,541

BILATERAL SWITCH USING COMBINATION OF FIELD EFFECT TRANSISTORS AND BIPOLAR TRANSISTORS

Ernam F. King, Allentown, Pa., assignor to Bell Telephone Laboratories, Incorporated, Murray Hill and Berkeley Heights, N.J., a corporation of New York Filed Apr. 17, 1969, Ser. No. 817,028
Int. Cl. H01l *19/00*
U.S. Cl. 317—235 6 Claims

ABSTRACT OF THE DISCLOSURE

The functions of a plurality of insulated gate field effect transistors and bipolar transistors are combined in a compound device which is electrically symmetrical (bilateral) and which has very high input impedance, low output impedance, and high current gain. The device is advantageously employed as a bilateral coupling element in digital integrated circuits, e.g., semiconductor memories, DC shift registers, and dynamic shift registers.

GOVERNMENT CONTRACT

The invention herein claimed was made in the course of, or under contract with the Department of the Army.

BACKGROUND OF THE INVENTION (1) Field of the invention

This invention relates to semiconductor circuits which employ combinations of field effect transistors (FET's) and bipolar transistors.

(2) Description of the prior art

Most commonly, semiconductor circuits which include combinations of FET's and bipolar transistors employ FET's of the insulated gate type (IGFET's). An IGFET is a three electrode, active circuit element comprising a pair of spaced-apart zones (source and drain) of one type semiconductivity disposed adjacent the surface of a region of the opposite type semiconductivity. A thin dielectric layer is disposed over the space between the source and drain; and a conductive (gate) electrode overlies the dielectric. Separate electrodes also are applied to the source and drain zones. Conduction of free charge carriers between the source and drain is enabled and modulated by applying a voltage to the gate electrode so as to alter the conductivity of the material between the source and drain.

Heretofore, semiconductor integrated circuits which have included IGFET's usually have not included bipolar transistors because of inherent difficulties in fabricating separate IGFET's and separate bipolar transistors in a common unitary semiconductive body. However, because of the inherently high internal impedance and low current handling capability of IGFET's, it is often advantageous to combine IGFET's and bipolar transistors so as to retain the high input impedance of the IGFET in combination with the lower output impedance and higher current capability of the bipolar transistors.

United States Pat. No. 3,264,493 to J. E. Price discloses an IGFET and a bipolar transistor in a Darlington connection which achieves the above-mentioned objective. However, the Price circuit is not electrically symmetrical (bilateral). Thus it is unsuitable for circuits, e.g., IGFET memory cells, which depend for their operation upon the action of a switch which provides current gain alternately in two directions, e.g., into and out of the cell.

SUMMARY OF THE INVENTION

An object of this invention is an advantageous combination of IGFET's and bipolar transistors for general use in semiconductor integrated circuits.

More specifically, an object of this invention is a compound circuit element which provides a bilateral switch having high input impedance and high output current handling capability.

Another object of this invention is a bilateral switch which has the aforementioned characteristics and which is conveniently fabricated in integrated circuit form.

Still another object of this invention is an improved IGFET memory system.

To these and other ends, I have invented a bilateral compound device which has the very high input impedance characteristic of IGFET's and the low output impedance and high current handling capability of bipolar transistors.

In brief, the compound device provides the equivalent of first and second input IGFET's interconnected with first and second output bipolar transistors. Due to the unique, built-in interconnection, the transistors share common semiconductor zones in the compound device with a resulting requirement of minimum semiconductor area.

In one embodiment, the compound device is formed in a silicon wafer, the bulk of which is of N-type conductivity. A first localized P-type zone adjacent the surface of the wafer provides simultaneously the drains for the two IGFET's and the bases for the two bipolars. Thus, it will be appreciated that the drains and bases are all electrically common. Second and third localized and spaced-apart N-type zones are disposed in the first P-type zone to provide the emitters for the bipolars. Fourth and fifth localized P-type zones are spaced from the first P-type zone and provide the sources for the two IGFET's. Separate conductive gate electrodes are disposed over, but insulated from, the surface of those portions of the bulk between the first and fourth zones and between the first and fifth zones. Electrodes are applied to each of the zones and to the N-type bulk which provides a collector common to both bipolars. The source of the first IGFET is connected to the emitter of the first bipolar; and the source of the second IGFET is connected to the emitter of the second bipolar.

In operation, the common collectors are connected to a positive supply voltage. Under suitable bias and signal conditions, the first IGFET and the second bipolar provide high input impedance, low output impedance, and high current gain in one direction in Darlington fashion. Symmetrically, with the bias and signal conditions reversed in polarity, the second IGFET and the first bipolar provide the Darlington characteristic in the other direction.

As will be appreciated more fully hereinbelow, the above-described characteristics are ideally suited for writing into and reading from individual IGFET memory cells.

It will be appreciated also that a device with the above-described characteristics is one of general applicability in the circuit art, both for amplifying and for switching applications.

BRIEF DESCRIPTION OF THE DRAWING

The invention will be better understood from the following more detailed description, in which.

DETAILED DESCRIPTION

To simplify and clarify the following detailed description, the field effect transistors will be presumed to be P-channel IGFET's and the bipolar transistors will be presumed to be NPN transistors. It will be appreciated by those in the art that analogous circuits and integrated circuit structures may be formed using analogous combinations of N-channel IGFET's and PNP bipolar transistors or junction field effect transistors and bipolar transistors.

As used in this disclosure, a P-channel IGFET comprises a pair of spaced-apart zones (source and drain) of P-type semiconductivity disposed adjacent the surface of a region of otherwise N-type semiconductivity. A thin dielectric layer is disposed over the space between the source and drain; and a conductive gate electrode overlies the dielectric. The device is considered to be turned on when a voltage is applied to the gate electrode so as to invert the portion of N-type semiconductivity between the spaced-apart zones to P-type semiconductivity. This converted portion is termed the P-type channel. In the absence of such a voltage the source and drain zones are separated by a region of opposite type conductivity and current flow between them is extremely small, e.g., typically of the order of picoamperes $10^{-12}$ amperes).

For the purpose of clarity, it will be understood that the terms source and drain are functional terms and that for the type of IGFET's described hereinbelow the terms are interchangeable. The source is considered to be the zone from which the P-type charge carriers flow and the drain is defined to be the zone to which they flow. Accordingly, the terms source and drain will be interchangeably applied to the spaced-apart P-type zones depending upon the polarity of voltage applied thereto.

Figure 1:
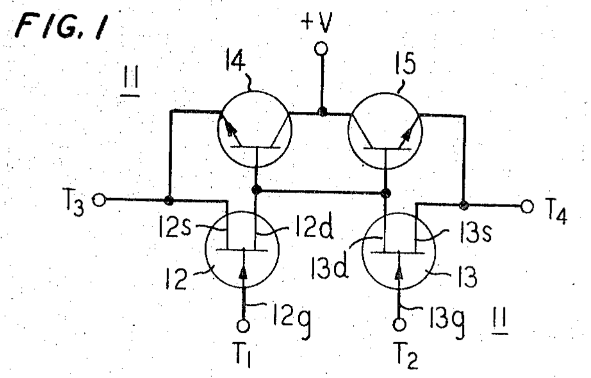
FIG. 1 shows in schematic form the approximate circuit equivalent of the compound device in accordance with this invention.

With reference now to FIG. 1, there is shown a bilateral circuit module 11 in accordance with the principles of this invention. A pair of matched input IFGET's 12 and 13 are interconnected with a pair of matched NPN bipolar transistors 14 and 15. More particularly, drain electrode **12*d* of IGFET 12 is connected to drain electrode 13*d* of IGFET 13 and to the base electrodes of both bipolar transistors 14 and 15. The source electrode 12*s* of IGFET 12 is connected to the emitter of bipolar transistor 14 and to an output terminal $T_3$. The source electrode of IGFET 13 is connected to the emitter of bipolar transistor 15**, and to an output electrode $T_4$.

The gate electrode **12*g* of IGFET 12 is connected to an input electrode $T_1$, and the gate electrode 13*g* of IGFET 13 is connected to a second input electrode $T_2$. Finally, the collector electrodes of transistors 14 and 15** are connected together and to a source of positive potential (+V).

Circuit module 11 is considered to be a bilateral element because the electrical characteristics of the module are electrically symmetrical with respect to output terminals $T_3$ and $T_4$.

In operation, circuit module 11 provides a very high input impedance to input terminals $T_1$ and $T_2$; a relatively low output impedance to output terminals $T_3$ and $T_4$; a relatively high current gain between either input electrode and its corresponding output electrode; and a relatively high current gain from either output electrode to the other. More specifically, the input impedance will be the input impedance of the IGFET transistor multiplied by the gain of one of the bipolar transistors; and the DC input impedance will be typically greater than $10^{15}$ ohms. The AC input impedance, of course, will be determined by the frequency of the input signal and the capacitance of the input terminal but in any case will be considerably greater than the input impedance of a bipolar transistor.

More specifically now, the operation of this circuit module 11 is as follows: Depending upon the polarity of voltages applied, either IGFET 12 and bipolar transistor 15 or IGFET 13 and bipolar transistor 14 can be caused to operate in Darlington fashion to provide the aforementioned circuit characteristics.

For example, assume the positive supply voltage (+V) is about 6 volts and that a positive voltage of a few volts or more is applied to output terminal $T_3$ relative to output terminal $T_4$. If a negative voltage sufficient to turn on IGFET 12 is applied to input terminal $T_1$, a positive current will flow into terminal $T_3$; through IGFET 12 from source to drain; through the base emitter junction of transistor 15; and out through terminal $T_4$. Thus, the current through IGFET 12 provides base drive to transistor 15 in Darlington fashion. It will be appreciated that with these voltage conditions, transistor 14 can conduct no base current because its emitter is more positive than its base. Also, the current flowing through IGFET 12 cannot flow through IGFET 13 because the P-channel IGFET is normally turned off, i.e., in a nonconducting state, in the absence of a sufficient negative voltage applied to its gate electrode **13*g***.

In symmetrical fashion, assume that a voltage is applied so that terminal $T_4$ is a few volts positive with respect to terminal $T_3$, and that a voltage is applied to input terminal $T_2$ sufficiently negative to turn on IGFET 13. Under these conditions, a positive current will flow into terminal $T_4$; through transistor 13 from source to drain; through the base-emitter junction of transistor 14; and out terminal $T_3$. Transistor 15 cannot conduct because its emitter is more positive than its base; and IGFET 12 cannot conduct because there is not applied to its gate electrode **12*g*** a voltage to turn it on.

Still with reference to FIG. 1, assume terminals $T_2$ and $T_4$ are left open; and terminal $T_1$ is connected to terminal $T_2$ so that gate electrode **12*g* of IGFET 12 is electrically common with the gate electrode 13*g* of IGFET 13. Further, assume that an input signal is applied to common terminal $T_1$ and $T_2$ sufficient to turn on the IGFET's 12 and 13. In this mode, IGFET's 12 and 13 are turned on, but are not conducting any current from source-to-drain because no transverse potential exists therebetween. However, it will be appreciated that a positive signal applied to terminal $T_3$ will produce a current through IGFET 12 and transistor 15 to produce an amplified replica of the signal at terminal $T_4$. Bilaterally, a positive signal applied to terminal $T_4$ will flow through IGFET 13 and be amplified through a transistor 14 to produce an amplified replica of the signal at terminal $T_3$. Thus it will be appreciated that circuit module 11** is adapted for the simultaneous amplification and bilateral coupling of signals between two circuit points $T_3$ and $T_4$.

It will be noted that with the gate electrodes connected together, both input IGFET's 12 and 13 turn on simultaneously. Thus, a current flowing from source-to-drain through one of these IGFET's divide so that some of the current flows into the base of one of the bipolars and some flows into the drain of the other IGFET. However, the devices easily can be adjusted so that the impedance at the drain of the other IGFET is much greater than the impedance at the base of the bipolars. In this manner, as great a percentage of the current as is desired can be forced to flow into the base of the bipolar rather than into the drain of the other IGFET.

Figure 2:
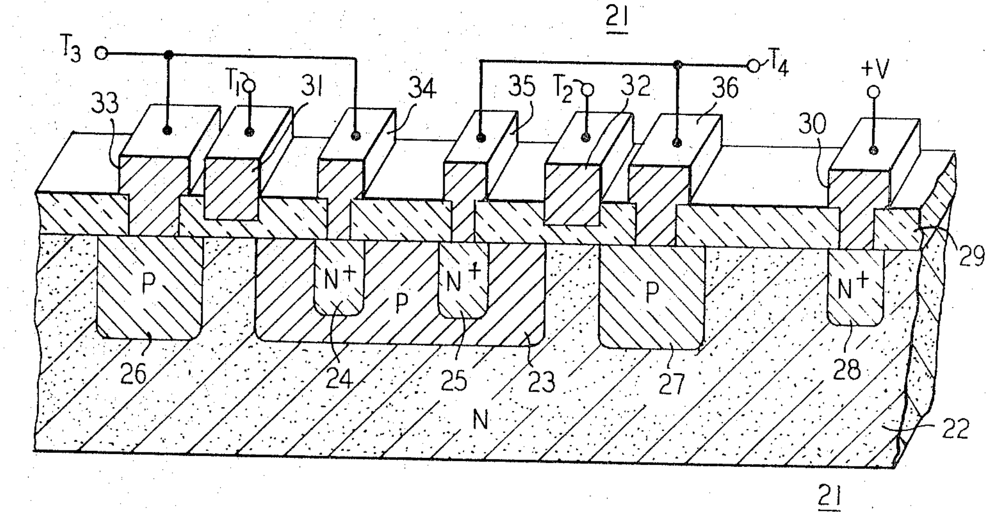
FIG. 2 shows an isometric cross section of an advantageous structural embodiment of the compound device in accordance with this invention.

In FIG. 2 there is shown an isometric cross section of an advantageous structural embodiment of the circuit module shown in FIG. 1. More specifically, FIG. 2 shows a portion 21 of a semiconductor wafer fabricated in any of a variety of ways known for semiconductor integrated circuits. Wafer 21 comprises an N-type bulk portion 22 containing a pattern of localized zones. P-type localized zone 23 simultaneously provides the drain of IGFET 12; the drain of IGFET 13; the base of transistor 14; and the base of transistor 15. This is possible because these drains and bases are all electrically common. $N^+$-type zone 24 provides the emitter of transistor 14, and $N^+$-type zone 25 provides the emitter of transistor 15. P-type zone 26 provides the source of IGFET 12, and P-type zone 27 provides the source of IGFET 13. N-type bulk portion 22 simultaneously provides both collectors for transistors 14 and 15 and a substrate for IGET's 12 and 13. $N^+$-type zone 28 facilitates a low resistance contact between metal electrode 30 and the N-type semiconductive portion 22. Electrode 31 disposed over the space between zones 23 and 26 provides the gate electrode for IGFET 12; and metallic electrode 32 disposed over the space between P-type zones 23 and 27 provides the gate electrode for IGFET 13. It will be appreciated that insulating layer 29 is a passivating insulating layer and generally will be thinner underneath the gate electrodes than over the rest of the semiconductive portion. Metallic electrodes 30, 33, 34, 35, and 36 provide low resistance electrical contact to the respective zones with which they are contiguous. Source electrode 33 and emitter electrode 34 are connected together and to an output terminal $T_3$; and emitter electrode 35 and source electrode 36 are connected together and to an output terminal $T_4$, as in FIG. 1.

It will be appreciated that although the semiconductive portion 21 shown in FIG. 2 does not include four separate transistors, it does provide the equivalent electronic function of two IGFET's and the two bipolars interconnected as shown in module 11 of FIG. 1. Accordingly, the semiconductive portion shown in FIG. 2 may be considered a single compound electronic device rather than being thought of as a collection of separate electronic elements.

In a typical embodiment, the compound device shown in FIG. 2 was integrated in a semiconductive area of about 5 square mils. The current gain factor for the IGFET's in that device was about 15 microamperes per square volt. The current gain factor for the bipolar transistors was about 30, giving an effective gain for each of the Darlington pairs of about 450 microamperes for square volt. Calculations show that a single IGFET with an equivalent current gain would require an area of about 50 square mils. Accordingly, the device of FIG. 2 has an improvement in area of about an order of magnitude for a given current gain.

Although it is believed that once having seen the structuer of FIG. 2 it will be apparent to those skilled in the art how to fabricate it, a few particular fabrication details are as follows. The P-type localized zones may be either diffused or ion implanted or may be fabricated by any of the well-known processes for altering the semiconductivity of a semiconductive wafer. In the above-mentioned embodiment the P-type zones were formed by solid state diffusion of boron to a depth of about 1.5 microns and with a surface concentration of about $10^{18}$ atoms per cubic centimeter. $N^+$-type emitter zones 24 and 25 and collector contact zones 27 were diffused using phosphorus to a depth of about 1 micron and with a surface concentration of greater than about $10^{20}$ atoms per cubic centimeter. The dielectric material under gate electrodes 31 and 32 included a dual layer comprising about 500 A. of aluminum oxide and an additional 500 A. of silicon oxide.

Although any of a variety of arrangements may be adopted for accomplishing actual electrical contact to the semiconductor zones and for accomplishing the interconnection of integrated arrays of functional elements, a particularly advantageous technique includes the use of a beam lead technology such as disclosed in the U.S. Pat. No. 3,335,338 to M. P. Lepselter.

Figure 3:
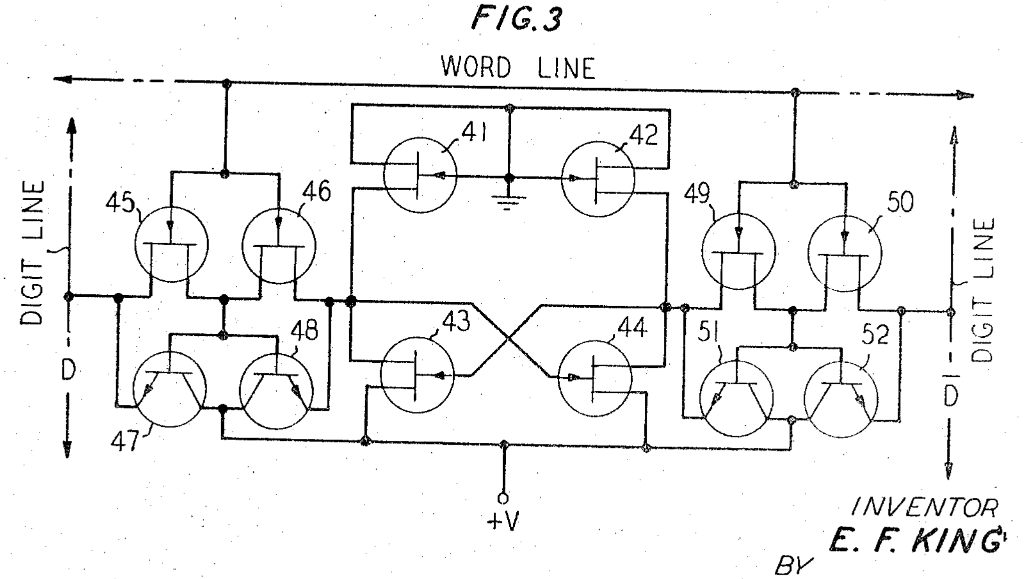
FIG. 3 shows a schematic circuit diagram illustrating the use of the compound device for connecting an IGFET memory cell to the digit lines in a semiconductor memory system.

FIG. 3 is a schematic diagram of a portion of a semiconductive memory utilizing the circuit module of FIGS. 1 and 2 for coupling between digit lines and individual memory cells. The general type of memory is a word-organized memory including a matrix of individual memory cells coupled to an array of word lines and digit lines in the manner disclosed by J. B. Schmidt in "Integrated MOS Transistor Random Access Memory," Solid State Design, January 1965, pages 21, 23. As therein disclosed, each memory cell is coupled to a pair of digit lines through an IGFET transistor which serves as a simple bilateral coupling element. However, the IGFET provides no current gain between the cell and the digit line. This is a problem inasmuch as it is usually desirable to have the reading and writing currents on the digit lines larger than, and independent of, the standby currents in the cells.

The arrangement shown in FIG. 3, using a pair of circuit modules as shown in FIG. 1 to couple the digit lines to these memory cells alleviates the aforementioned problem. As shown, the memory cell includes IGFET's 41 and 42 as load impedances and IGFET's 43 and 44 as the cross-coupled active flip-flop transistors. IGFET's 45 and 46 in combination with bipolar transistors 47 and 48 provide bilateral coupling with current gain between the flip-flop and one of the digit lines, e.g., D. IGFET's 49 and 50 in combination with bipolar transistors 51 and 52 provide bilateral coupling with gain between the flip-flop and the other digit line, e.g. $\overline{D}$.

The gate electrodes of load IGFET's 41 and 42 are connected to the drains of those IGFET's respectively, and are connected together, and to an electrical ground. The source electrode of load IGFET 41 is connected to the drain electrode of IGFET 43 and to the gate electrode of IGFET 44. The source electrode of load IGFET 42 is connected to the drain electrode of IGFET 44 and to the gate electrode of IGFET 43. The source electrode of IGFET 43 is connected to the source electrode of IGFET 44 and to a positive supply voltage, e.g., about 6 volts. Each of the bilateral coupling modules has one of its output electrodes connected to a digit line (D or $\overline{D}$) and the other of its output electrodes connected to the memory cell, as shown in FIG. 3.

In operation, the word line normally is held near the positive supply voltage level (about +6 volts). If the word line is switched to near ground level, a sufficiently negative voltage is presented to the gate electrodes of IGFET's 45, 56, 49, and 50 to turn them on. However, no current flows between the digit lines and the memory cell unless there is a voltage imbalance therebetween.

Information is written into the cell from the digit lines while the word line is held near ground level by forcing the digit line pairs D and $\overline{D}$ to opposite voltage levels. For example, if digit line D is positive with respect to digit line $\overline{D}$, IGFET 43 tends to turn on and IGFET 44 tends to turn off.

Information is read from the cell in the following manner. Depending on which of the flip-flop IGFET's 43 or 44 is conducting at any given time, the drain electrode of one of them will be at a higher voltage level than the drain electrode of the other. When the word line is transferred to near ground level, this voltage imbalance at the drains of IGFET's 43 and 44 will be amplified and transferred to the digit lines where it may be detected in a balanced detection circuit of any of a variety of types well known in the art.

Although the invention has been described with respect to certain specific embodiments, it will be understood that modifications and variations of the invention may be resorted to without departing from the spirit and scope of the invention.

For example, the coupling module of FIG. 1 advantageously can be used in a word-organized memory in which each cell is coupled to two word lines and one digit line. One of the output terminals ($T_3$ and $T_4$) of the coupling module would be connected to the cell and the other output terminal would be connected to a digit line. Each of the input terminals ($T_1$ and $T_2$) would be connected to separate ones of the two word lines. In the standby mode, both word lines would be maintained at a voltage such that the coupling module would be nonconducting in both directions. Changing the voltage on one of the word lines would enable conduction of current from the digit line into the cell for writing information into the cell. Changing the voltage on the other word line would enable conduction from the cell to the digit line for reading information from the cell.

Further, it will be apparent that the coupling module of FIG. 1 may be used for the coupling and amplification of analog signals as well as digital signals.

I claim:

1. A bilateral circuit module comprising
first and second input field effect transistors (FET's),
first and second output bipolar transistors,
means connecting the drain electrode of each FET to the drain electrode of the other FET,
means connecting the base electrode of each bipolar transistor to the base electrode of the other bipolar transistor and to the drains of the FET's,
means connecting the source electrode of the first FET to the emitter electrode of the first bipolar transistor and to a first output terminal,
means connecting the source electrode of the second FET to the emitter electrode of the second bipolar transistor and to a second output terminal.
means connecting the collector electrode of each bipolar transistor to the collector electrode of the other bipolar transistor and to a terminal adapted for connection to a source of electric power,
means connecting the gate electrode of the first FET to a first input terminal, and
means connecting the gate electrode of the second FET to a second input terminal.

2. A module as recited in claim 1 wherein the FET's are insulated gate field effect transistors (IGFET's).

3. A module as recited in claim 1 wherein the FET's are P-channel IGFET's and the bipolar transistors are NPN transistors.

4. A semiconductor device for providing a bilateral integrated circuit module including the electronic functions of first and second input insulated gate field effect transistors (IGFET's) and first and second output bipolar transistors comprising:
a semiconductor wafer, the bulk of which is of one type semiconductivity;
a first localized zone of the opposite type semiconductivity adjacent the surface of the wafer for providing the drains for the IGFET's and the bases for the bipolar transistors;
second and third localized zones of the one type semiconductivity nested within the first zone and spaced from each other for providing emitters for the bipolar transistors;

a fourth localized zone of the opposite type semiconductivity adjacent the surface of the wafer and spaced from the first zone for providing a source for the first IGFET;
a first conductive gate electrode insulated form, but disposed over, the surface of that portion of the bulk between the first and fourth zones;
a fifth localized zone of the opposite type semiconductivity adjacent the surface of the wafer and spaced from the first zone for providing a source for the second IGFET; and
a second conductive gate electrode insulated from, but disposed over, the surface of that portion of the bulk between the first zone and the fifth zone.

5. In combination,
a plurality of bilateral circuit modules in accordance with claim 1;
a plurality of semiconductor memory cells; and
means forming a plurality of conduction paths for connecting the cells to circuitry adapted for selectively controlling and sensing the state of each cell;
each of said cells being coupled through at least one of said bilateral circuit modules to at least one of said conduction paths.

6. In combination,
a plurality of bilateral circuit modules in accordance with claim 1;
means forming a plurality of word line conduction paths;
means forming a plurality of digit line conduction paths; and
an array of semiconductor memory cells;
each of said cells being connected to an output terminal of at least one of said modules;
the other output terminal of said module being connected to a digit line conduction path; and
the input terminals of said module being connected to at least one word line conduction path.

References Cited

UNITED STATES PATENTS

| | | | |
|---|---|---|---|
| 3,264,493 | 8/1966 | Price | 317—235 |
| 3,275,912 | 9/1966 | Kunz | 317—235 |
| 3,391,354 | 7/1968 | Ohashi et al. | 307—304 |
| 3,492,505 | 1/1970 | Entenmann | 307—279 |

JERRY D. CRAIG, Primary Examiner

U.S. Cl. X.R.

307—249, 251, 279, 303, 304; 340—173